United States Patent [19]

Hamaya

[11] Patent Number: 5,189,352
[45] Date of Patent: Feb. 23, 1993

[54] DRILLING RESTART CONTROL SYSTEM
[75] Inventor: Yasuhiko Hamaya, Toyama, Japan
[73] Assignee: NEC Corporation, Tokyo, Japan
[21] Appl. No.: 790,267
[22] Filed: Nov. 8, 1991
[30] Foreign Application Priority Data
　Nov. 8, 1990 [JP] Japan .................................. 2-304476
[51] Int. Cl.⁵ ......................... H05K 3/00; G05B 19/18
[52] U.S. Cl. .................... 318/569; 318/600;
364/474.16
[58] Field of Search ..................... 318/568.1, 569, 600,
318/671, 430, 431, 563; 364/474.01, 474.16,
474.19, 474.21, 474.27, 474.28, 474.35

[56]　　　　　References Cited
U.S. PATENT DOCUMENTS

| 4,530,046 | 7/1985 | Munekata et al. | 364/191 |
| 4,604,705 | 8/1986 | Imanishi | 364/474.32 |
| 4,704,689 | 11/1987 | Asakura | 364/474.33 |
| 4,751,652 | 6/1988 | Kiya et al. | 318/563 X |
| 4,788,481 | 11/1988 | Niwa | 318/600 |
| 4,972,322 | 11/1990 | Asakura et al. | 318/568.1 X |
| 4,978,901 | 12/1990 | Hirai | 318/568.1 X |
| 5,111,383 | 5/1992 | Kimura et al. | 318/563 X |

Primary Examiner—Bentsu Ro
Attorney, Agent, or Firm—Laff, Whitesel, Conte & Saret

[57]　　　　　ABSTRACT

A drilling restart control system is for restarting an NC drilling machine for a printed wiring board or the like. A drilling data block provides for a bore diameter, a drilling position, and detection of a complete block. A host computer reads data from a storage medium and the data processing is executed. A series of drilling instructions is stored in a memory with protection against power failure. When a restarting of the drilling operation is indicated, the machining operation is reserved until the data coincides with the contents stored in the memory with protection against power outage.

3 Claims, 2 Drawing Sheets ically, the position on the X-Y plane and the movements in the Z-axis direction of the drilling blades, the latest information concerning the position on the X-Y plane and the position in the Z-axis direction, and information as to the completion of the machining for the drilling position are stored in a nonvolatile memory for each of the holes to be opened in parallel with the progress of the machining. Further, when a command which indicates restarting of the machining is given after temporary interruption, the various kinds of detailed information at the time immediately before the interruption which is stored in the nonvolatile memory is read out from the nonvolatile memory to return the execution conditions of the drilling work to the conditions at the time immediately before the interruption based on the detailed information, and the drilling work is restarted from these conditions.

However, the NC drilling machine according to the Patent '652 requires the storage of the detailed information such as the modal data and the sequence numbers in the nonvolatile memory. Therefore, it brings about an increase in the kinds and the quantity of data to be stored, as well as makes the NC program to be complicated, sharply increasing the step number of the NC program for each drilling so that, when it is necessary to drill a large number of holes as in the printed circuit board, the increase in the kinds and quantity of the data spoils the response speed of the NC system as a whole, causing the high speed operation of the machining to be hard to accomplish.

Moreover, the NC drilling machine of the Patent '652 has to be constructed in such a way as to be able to correctly restart the drilling for all of the sequence numbers assigned to the respective moving paths. For that reason, the NC program necessitates a variety of restarting points, eventually requring a large amount of developmental manpower. In particular, when the entirety of the NC machining of the workpiece can be simplified as in a PWB, the NC drilling machine of the Patent '652 is obstructing the improvement of the ratio of the cost to performance owing to the too much complexity of the system as a whole.

SUMMARY OF THE INVENTION

It is therefore an object of the present invention to provide a drilling restart control system of an NC drilling machine which can rapidly achieve the restarting of the machining after a temporary interruption due to power failure or the like by a simplified mechanism without being accompanied by a duplication of the machining.

It is another object of the present invention to provide or drilling restart control system of an NC drilling machine which can easily accomplish the above-mentioned rapid restarting of the machining without sharply increasing the step number of the NC program.

In the present drilling restart control system, a drilling data is formed by combining a block of data which specifies the diameter of the drilling blade for opening a plurality of holes for each of drilling blades having respective diameters that correspond to the respective holes of a plurality of mutually different sizes, and a block of X and Y coordinate data which define each drilling position of a plurality of holes to be opened, and these data are input sequentially. In the course of progress of the normal operation of the drilling work, the data block which specifies the diameter of the drilling blade in operation and the number of holes that were opened by that time using the drilling blade are stored in a memory with protection against power failure. In restarting the drilling operation, the position for restarting the machining is determined by reading from the memory the diameter of the drilling blade and the number of holes opened by that drilling blade.

In the present invention, the amount of data to be saved accompanying the progress of the machining operation can sharply be decreased compared with the case of the Patent '652, so that the capacity of the memory with protection against power outage can be reduced markedly. Further, the NC program can be simplified by giving a block construction to the drilling data as in the above, so that it is possible to improve the ratio of the cost to performance of the NC drilling machine.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DESCRIPTION OF THE PREFERRED EMBODIMENT

Figure 1:
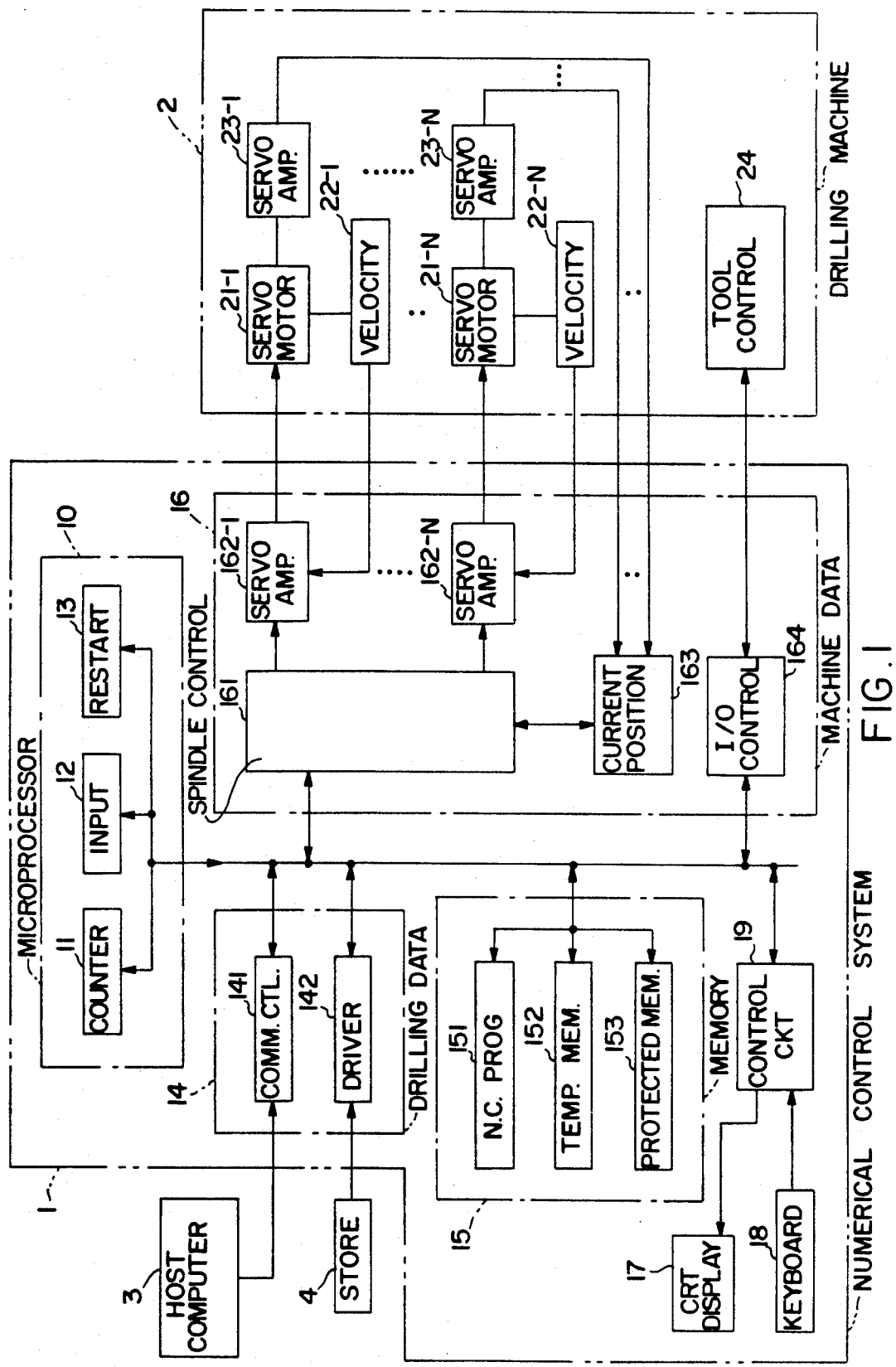
FIG. 1 is a block diagram of one embodiment of the present invention.

Referring to FIG. 1, an NC system 1 shown in the figure controls a drilling machine 2 which carries out drilling in accordance with the machining data including the data that specify the diameters of the holes to be formed and the positions of the holes in a platelike workpiece such as a PWB.

The NC system 1 is constituted of a processor 10 which is ordinarily formed of count processing means 11, input processing means 12, and working restart processing means 13, as well as drilling data input means 14 which receives an input drilling data from a host computer 3 or a storage medium 4 (a flexible disk or the like), a memory 15 which stores an NC program, the input drilling data, a drilling data to be protected against electric power failure, machining data imparting means 16 which gives the machining data to the drilling machine, and an operation control circuit 19 which controls a CRT display 17 and a key board 18.

Further, the drilling data input means 14 includes a communication control circuit 141 which controls the data communication with the host computer 3, and a medium driving equipment 142 which drives the storage medium 4. Here, the storage medium 4 may be constructed of a cassette magnetic tape, a hard disk, an optical disk or the like, not only of a flexible disk.

The memory 15 includes a ROM 151 which is a nonvolatile memory that stores an NC program, a RAM 152 without protection against power outage which is a volatile memory that temporarily stores the input drilling data, and a RAM 153 with protection against power outage by means of a battery, which stores a part of the data to be protected even if power outage takes place. Here, the RAM 153 with protection against power outage may be replaced by a nonvolatile memory.

The machining data imparting means 16 includes a spindle control circuit 161 which controls each of the X axis, Y axis, Z axis, servo amplifiers 162-1 to 162-N which amplify signals which represent moving quantities of the respective spindles that are supplied from the spindle control circuit 161 and send the result to the drilling machine 2, a current position counter 163 which counts the current position by receiving a position count signal from the drilling machine 2, and an input/output control circuit 164 which drives the drill in response to the input drilling data.

The drilling machine 2 includes servo motors 21-1 to 21-N which are actuated in response to the servo amplifiers 162-1 to 162-N, respectively, velocity detectors 22-1 to 22-N which detects the moving velocities of these servo motors and feed them back to the servo amplifiers 162-1 to 162-N, position detectors 23-1 to 23-N which send the position counter signals that are proportional to the respective moved quantities of the servo motors 21-1 to 21-N to the current position counter 163, and a tool control mechanism 24 which controls the grasp and control of the drilling blade in response to the signal from the input/output control circuit 164.

Figure 2:
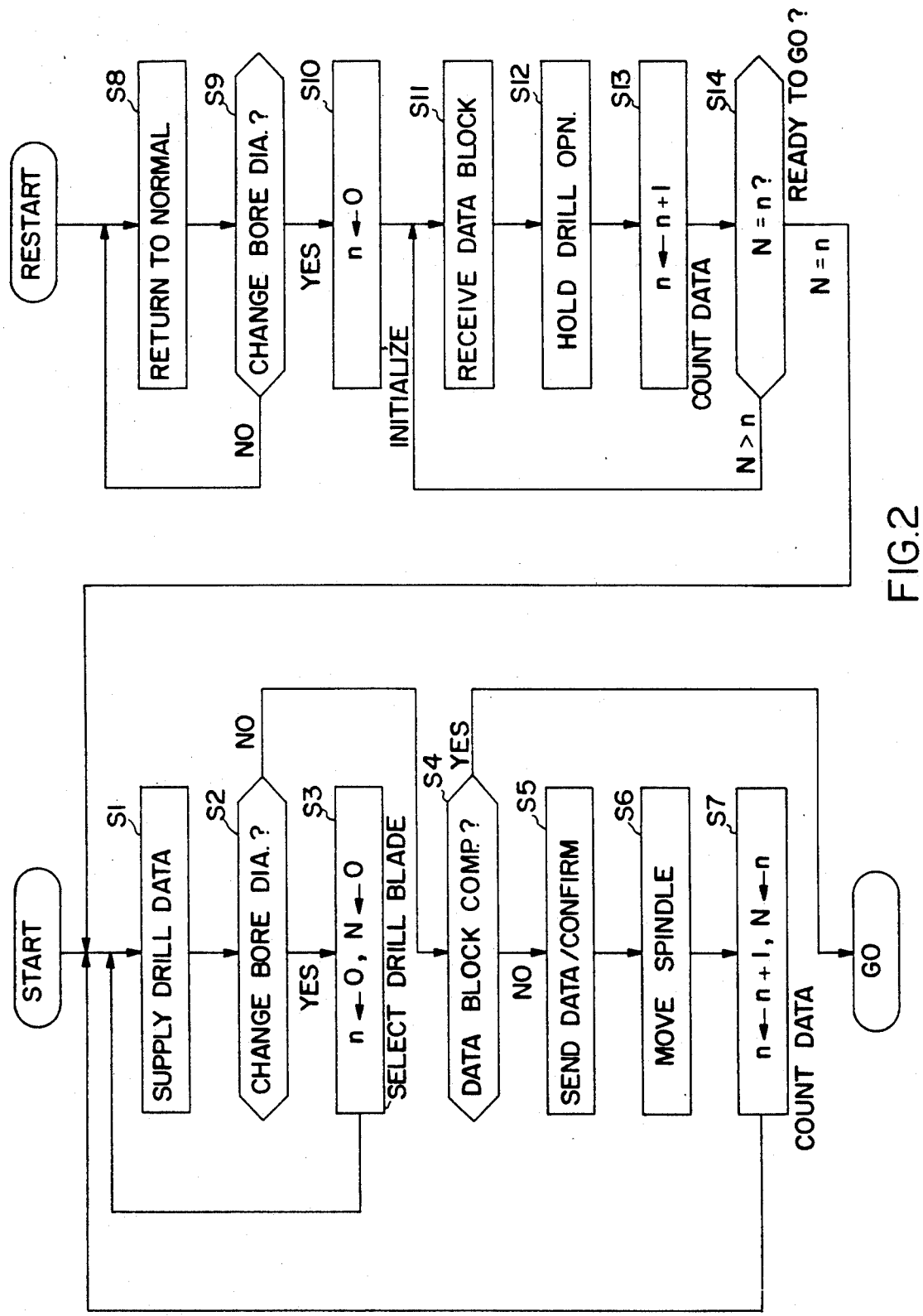
FIG. 2 is the flow chart for an example of the operation of the embodiment shown in FIG. 1.

Referring to FIG. 2, when a start indication for an ordinary drilling operation which is input to the operation control circuit 19 as a result of operation of the keyboard 18 by the operator while watching the CRT display 17, the processor 10 of the NC system 1 requests one block of the drilling data from the input processing means 12 to the drilling data input means 14. As the drilling data is sequentially supplied one block after another, in response to the above-mentioned request, to the drilling data input means 14 from the host computer 3 or the storage medium 4, the processor 10 supplies the drilling data to the machining data imparting means 16 (step S1).

At the same time, the input processing means 12 judges for each input drilling data block whether it is a bore diameter block which indicates the change of the bore diameter, and supplies the contents of the block also to the count processing means 11 (step S2).

The machining data imparting means 16 that is supplied with a bore diameter block makes the drilling blade grasping spindle of the drilling machine 2 to grasp a drilling blade that corresponds to the bore diameter indicated by said block. Namely, the axis control circuit 161 sends a movement signal via the servo amplifiers 162-1 to 162-N, and drives the spindle by means of the servo motors 21-1 to 21-N to the position of the drilling blade corresponding to the bore diameter while confirming the current position by the current position counter 163. At this time, the velocity detectors 22-1 to 22-N feed back the moving velocities to the servo amplifiers 162-1 to 162-N, respectively, whereas the position detectors 23-1 to 23-N feed back the position count signal corresponding to the moved quantities to the current position control 163. The input/output control circuit 164 controls the tool control mechanism 24 to let the spindle grasp and drive the drilling blade that corresponds to the above-mentioned bore diameter. Further, the count processing means 11 lets the RAM 153 without protection against power outage store the bore diameter value indicated by the bore diameter block, and initializes the hole number count value n of the RAM 152 without protection against power outage and the hole number store value N of the RAM 153 to the value "0", then returns to step S1 (step S3).

When the block of the input drilling data is not a bore diameter block, the input processing means 12 judges whether the block is a completion block which shows the completion of a drilling block, and if it turns out to be a completion block, the machining data imparting means 16 and the drilling machine 2 are directed to return the drilling blade (the operation reverse to that of the preparation of the drilling blade) and the machining operation is stopped, completing the input operation of the drilling data (step S4).

When the block of the input drilling data is neither a bore diameter block nor a completion block, the input processing means 12 judges it to be a drilling block, and supplies it to the machining data imparting means 16.

The axis control circuit 161 of the machining data imparting means 16 prepares a machining data in response to the drilling block, and sends the machining data to the drilling machine 2. Namely, the spindle control circuit 16 sends a spindle moving signal to the drilling machine 2 through the servo amplifiers 162-1 to 162-N, and confirms the current position by the current position counter 163 which received position count signals corresponding to the moving quantities from the drilling machine 2 (step S5).

In this way, the drilling machine 2 opens a hole corresponding to each of the machining data. In other words, the servo motors 21-1 to 21-N shift the spindle to the position indicated by the machining data to move the spindle up and down, and performs the predetermined drilling operation by feeding back the values of the velocities and the shifts found by the velocity detectors 22-1 to 22-N and the position detectors 23-1 to 23-N (step S6).

The count processing means 11 counts up the hole number count value n of the RAM 152 by unity and updates the hole number storage value N of the RAM 153 to the hole number count value n after the count-up to return to step S1 (step S7).

In restarting machining after a temporary interruption due to power outage or the like, the operator returns the drilling machine 2 to the starting position of the machining operation and inputs an indication of restarting of the drilling machining operation to the operation control circuit 19 by an operation of the keyboard 18 while watching the CRT display 17. In response to this, the machining restart processing means 13 of the processor 10 indicates the drilling data input means 14 via the input processing means 12, by fetching the drilling data from the computer 3 or the storage medium 4 block by block from the beginning (step S8).

The machining restart processing means 13 detects for each block of the input drilling data whether it is a bore diameter block or whether the bore diameter value indicated by the bore diameter block coincides with the bore diameter stored in the RAM 153, namely, the bore diameter at the time immediately before the temporary interruption. If the block is not a bore diameter block or if it does not coincides with the bore diameter value at the time immediately before the temporary interruption, it goes back immediately to Step 8, and let the next block to be input from the drilling data input means 14. Further, if the coincidence with the bore diameter value at the time immediately before the temporary interruption is obtained, the drilling blade corresponding to the bore diameter is caused to be grasped by the spindle and driven, and the system moves to the next Step 10 (step S9).

Next, the machining restart processing means 13 initializes the hole number count value n of the RAM 152 to set it to be "0" via the count processing means 11 (step S10), and let the drilling data input means 14 receive a drilling block of one block of the next drilling block via the input processing means 12 (step S11).

Moreover, the machining restart processing means 13 lets the hole position control by the drilling data take place via the machining data imparting means 16, by keeping the drilling operation of the drilling machine 2 halted (step S12). If at this time the drilling data displays the drilling position in terms of its absolute position, it is sufficient to reserve one block portion of the response to the data. However, if the drilling position is displayed by an incremented value with one preceding drilling position as the reference, the drilling blade is once driven to the drilling position. Note, however, that the drilling drive by the vertical movement of the spindle is omitted.

The machining restart processing means 13 next counts up the hole number count value n of the RAM 152 by unity via the count processing means 11 (step S13). The machining restart processing means 13 then detects whether there exists a coincidence between the hole number count value n of the RAM 152 and the hole number storage value N of the RAM 153 with protection against power outage. If there is no coincidence (N>n), it goes back to step S11 after completing the data processing related to that drilling block, and let the drilling data input means 14 fetch the next drilling block from the computer 3 or the storage medium 4 through the input processing means 12. On the other hand, when both of the aforementioned values are coincident with each other (N=n), the system goes back to step S1 to proceed to the inputting of the next one block of the drilling data by the input processing means 12, to restart the normal drilling machining operation (step S14).

As described in the above, the drilling restart control system for an NC drilling machine according to the present invention is capable of rapidly accomplishing the drilling restart after a temporary interruption due to power failure of the like using a simple structure and without being accompanied by a duplicate machining. Therefore, it is possible to prevent the generation of defective products or the breakage of the drilling blade, and to sharply reduce the remachining time since no remachining operation for the already machine holes is involved.

Moreover, the drilling restart control system for an NC drilling machine according to the present invention can easily accomplish the rapid restart of machining without regard to the complexity or the increase in the step number of the NC program, so that it is possible to cut the manpower in the development of the NC program.

Although the invention has been described with reference to a specific embodiment, this description is not meant to be construed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

What is claimed is:

1. A drilling restart control system for an NC drilling machine comprising:

a supplying source of drilling data representing a plurality of holes of a plurality of diameters to be drilled in a platelike workpiece, said drilling data being defined in the form of data blocks showing the diameters of the holes and a plurality of positions on said workpiece;

machining data imparting means for supplying driving signals to the drilling machine so as to execute drillings of said workpiece as indicated in said data blocks by processing said drilling data for each of said data blocks;

position data supplying means for supplying the current position of a tool installed in said drilling machine;

a memory with protection against electric power failure which stores the diameters of said holes and the number of holes formed by machining for each of these diameters;

machining start indicating means for indicating a start or a restart after temporary interruption of said drilling machining to said machining data imparting means;

means for generating a coincidence signal between the drilling data from said supplying source and the contents of said memory when they are compared in response to the indication from said machining start indicating means, and are found to coincide with each other; and means for reserving said drilling machining from the receipt of the indication by said machining start indicating means until the generation of said coincidence signal.

2. A drilling restart control system for an NC drilling machine comprising:

drilling data input means for supplying drilling data which include a bore diameter block for each bore diameter for indicating the bore diameter, that is, the diameter of the drilling blade, a drilling block which indicates the drilling position for each hole to be opened, and completion blocks, in order to drill a plurality of holes with a plurality of diameters to be opened in a thin platelike workpiece;

machining data imparting means for supplying the respective driving signals so as to make drilling blade of indicated diameter to be grasped if said drilling data supplied is said bore diameter block, and so as to carry out the indicated drilling machining if said drilling data is a drilling block;

a drilling machine which makes a drilling blade grasping spindle grip the relevant drilling blade, and executes drilling to said workpiece by making the spindle move on the X-Y plane and on the Z axis;

a memory with protection against electric power failure which stores temporarily the diameter of the relevent drilling blade under machining and the number of holes formed by machining with that diameter;

input processing means for determining by making the respective blocks of said drilling data sequentially input, in response to a start indication for machining, to said drilling data input means, and giving the block to said machining data imparting means and indicating the update of the diameter and the initalization of the number of holes in said memory with protection against power outage if the block is said bore diameter block, giving the block to said machining data imparting means and indicating the update of the number of holes in said memory with protection against power outage if the block is said drilling block, and indicating the completion of the operation if the block is said completion block;

count processing means for updating the diameter and initializing the number of holes in said memory with protection against power outage, according to the indication from said input processing means, if the indication is related to said bore diameter block, and for increasing the number of holes in said memory with protection against power outage if the indication is related to said drilling block; and machining restart processing means for making said drilling data sequentially input from the beginning to said drilling data input means through said input processing means, in response to a restart indication after an interruption of the machining, count said drilling block whenever there appears said bore diameter block through said count processing means while halting the drilling work of said drilling machine, and when the number of said drilling blocks that are input coincides with the number of holes in said memory with protection against power outage after coincidence between the diameter shown by said bore diameter block that is input and the diameter in said memory with protection against power outage, start the drilling work of said drilling machine for the input of the next drilling block, the return to the normal operation by the start indication of said machining.

3. A method for a drilling restart control system, said method comprising the steps of:

storing, by a start indication, the bore diameter value in a nonvolatile memory for each bore diameter to be drilled, and initializing a hole number storage value to be stored in said nonvolatile memory;

inputting sequentially data blocks of drilling data, sending out a machining data which carries out hole position control by means of the contents of said data block to a drilling machine, and executing drilling work by said drilling machine;

updating by counting up said hole number storage value of said nonvolatile memory, for each of said drilling work, and then repeating the ordinary drilling operation by proceeding to the reading of said data block that arrives next; and inputting said data blocks sequentially from the beginning upon receipt of a restart indication following a temporary interruption, and after carrying out hole position control without execution of the drilling work by said drilling machine until the same bore diameter and the same number of holes with that bore diameter as said bore diameter value and said hole number storage value that are stored in said nonvolatile memory are found by reference to said data blocks that are input, proceeding to the normal drilling operation which executes the drilling work starting with the subsequent input of said data block.

* * * * *